(12) United States Patent
Schroeder et al.

(10) Patent No.: US 6,605,396 B2
(45) Date of Patent: Aug. 12, 2003

(54) RESOLUTION ENHANCEMENT FOR ALTERNATING PHASE SHIFT MASKS

(75) Inventors: Uwe Paul Schroeder, Dresden-Langebrueck (DE); Tobias Mono, Dresden (DE); Veit Klee, Pleasant Valley, NY (US)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 09/923,527

(22) Filed: Aug. 6, 2001

(65) Prior Publication Data

US 2003/0027057 A1 Feb. 6, 2003

(51) Int. Cl.[7] .............................. G03F 9/00; G03F 7/00; H01L 21/38
(52) U.S. Cl. ............................... 430/5; 430/30; 430/311; 430/313
(58) Field of Search ................ 430/30, 5, 311, 430/313, 394, 396

(56) References Cited

U.S. PATENT DOCUMENTS

| | | | |
|---|---|---|---|
| 5,286,581 A | 2/1994 | Lee | 430/5 |
| 5,348,826 A | 9/1994 | Dao et al. | |
| 5,362,584 A | 11/1994 | Brock et al. | 430/5 |
| 5,403,682 A | 4/1995 | Lin | 430/5 |
| 5,424,154 A * | 6/1995 | Borodovsky | 430/5 |
| 5,563,012 A * | 10/1996 | Neisser | 430/22 |
| 5,595,843 A * | 1/1997 | Dao | 430/5 |
| 5,688,409 A * | 11/1997 | Dao et al. | 430/5 |
| 5,718,829 A * | 2/1998 | Pierrat | 430/5 |
| 6,187,480 B1 | 2/2001 | Huang | 430/5 |
| 6,306,558 B1 | 10/2001 | Lin | |
| 2001/0021477 A1 * | 9/2001 | Dirksen et al. | 430/5 |
| 2002/0151157 A1 * | 10/2002 | Kim et al. | 438/552 |

FOREIGN PATENT DOCUMENTS

| | | |
|---|---|---|
| JP | 07 152144 A | 6/1995 |
| WO | WO 01/65316 A1 | 9/2001 |

OTHER PUBLICATIONS

Levenson and Arnold, "Phase–shifting masks", Handbook of Microlithography, Micromachining, and Microfabrication, P. Rai–Choudury ED., 1997, pp. 74–82, vol. 1, Spie Press.

* cited by examiner

Primary Examiner—Mark F. Huff
Assistant Examiner—K Sagar
(74) Attorney, Agent, or Firm—Slater & Matsil, L.L.P.

(57) ABSTRACT

An alternating phase shift mask (400) and method of manufacturing thereof including assist edges (450) and (452) surrounding a main phase edge (420). Assist edges (450) and (452) improve the resolution of the alternating phase shift mask (400), thus enabling the patterning of smaller size features on a semiconductor wafer.

31 Claims, 4 Drawing Sheets

RESOLUTION ENHANCEMENT FOR ALTERNATING PHASE SHIFT MASKS

TECHNICAL FIELD

The present invention relates generally to masks used in making semiconductors devices, and more particularly to phase shift masks.

BACKGROUND

In semiconductor device manufacturing, features and geometric patterns are created on semiconductor wafers using conventional optical photolithography. Typically, optical photolithography involves projecting or transmitting light through a pattern made of optically opaque areas and optically clear areas on a mask.

A prior art mask 100 used to pattern a semiconductor wafer is shown in FIG. 1. A transparent substrate 102 comprising silicon quartz, for example, is provided. An opaque layer 104 is deposited over the substrate 102. The opaque layer 104 typically comprises chrome, for example. The opaque layer 104 is patterned with the desired pattern so that light may pass through holes 106 in the opaque layer 104 when the mask is used to pattern a semiconductor wafer. This type of mask 100 is often referred to as a binary chrome-on-glass mask.

The optically opaque areas 104 of the pattern block the light, thereby casting shadows and creating dark areas, while the optically clear areas 106 allow the light to pass, thereby creating light areas. Once the light areas and dark areas are formed, they are projected onto and through a lens and subsequently onto a semiconductor substrate. However, because of increased semiconductor device complexity that results in increased pattern complexity, and increased pattern packing density on the mask, the distance between two of the opaque areas 104 is continually being decreased.

By decreasing the distances between the opaque areas 104, small apertures are formed which diffract the light that passes through the apertures. The diffracted light results in effects that tend to spread or to bend the light as it passes through the mask 100 so that the space between the two opaque areas is not resolved, therefore making diffraction a severe limiting factor for optical photolithography. More particularly, imaging is degraded because light from clear areas 106 on the mask 100 is diffracted into regions that ideally would be completely dark. The nominally dark region has light diffracted into it from the space on either side.

A conventional method of dealing with diffraction effects in optical photolithography is achieved by using a phase shift mask (PSM), which replaces the previously discussed mask. Generally, with light being thought of as a wave, the term "phase shifting" refers to a change in timing or a shift in waveform of a regular sinusoidal pattern of light waves that propagate through a transparent material. Typically, phase shifting is achieved by passing light through areas of a transparent material of either differing thicknesses or through materials with different refractive indexes, thereby changing the phase or the periodic pattern of the light wave.

Phase shift masks attempt to reduce diffraction effects by combining both diffracted light and phase-shifted light so that constructive and destructive interference takes place. The desired result of using a phase shift mask is that a summation of the constructive and destructive interference results in improved resolution and improved depth of focus.

One particular type of phase shift mask is an alternating phase shift mask. An example of an alternating phase shift mask 200 is shown in FIG. 2. A transparent substrate 202 comprising silicon quartz, for example, is provided. An opaque layer 204 is deposited over the substrate 202. The opaque layer 204 typically comprises chrome, for example. The opaque layer 204 is patterned with a desired patterned so that light may pass through holes 206 in the opaque layer 204 when the mask is used to pattern a semiconductor wafer. A phase shifting material 208 is deposited over the opaque layer 204. The phase shifting material 208 is patterned, and portions are removed to leave transparent regions 206 and transparent phase shifted regions 209 through which light can pass through to illuminate and pattern a semiconductor wafer.

In an alternating phase shift mask 200, alternating clear regions 209 cause the light to be phase-shifted 180 degrees, so that light diffracted into the nominally dark area from the clear area 209L to the left will interfere destructively with light diffracted from the right clear area 209R. This destructive interference of diffracted light results in improved image contrast, as shown in FIG. 3.

FIG. 3 illustrates a comparison of the light intensity 110 of a conventional mask 100 such as the one shown in FIG. 1 with the light intensity 210 of an alternating phase shift mask 200 shown in FIG. 2. The higher slope of the light intensity 210 curve of the alternating phase shift mask 200 indicates a higher resolution and improved image contrast compared to the light intensity 110 curve of a conventional mask 100.

The alternating phase shift mask 200 includes clear area 206 (0 degrees) adjacent clear area 209 (shifted by 180 degrees). These phase shifted clear areas 206/209 may interfere destructively, resulting in the light intensity distribution profile shown in FIG. 4 at 212. This optical image may change the topology of the resist pattern, requiring further process steps or different types of alternating phase shift masks be used to prevent or minimize this effect. For example, excess resist resulting from phase conflicts at line ends on the semiconductor wafer are often trimmed away in a second exposure step. Prior art alternating phase shift masks utilize one phase edge (region where clear area 206 abuts phase shifted clear area 208) to pattern a feature.

SUMMARY OF THE INVENTION

The present invention achieves technical advantages as an alternating phase-shift mask and method of manufacturing thereof having improved resolution. Assist phase edges are positioned on either side of a phase edge to enhance the ultimate resolution of an alternating phase-shift mask.

A preferred embodiment of a method of manufacturing a phase shift mask includes providing a transparent substrate, patterning the substrate with a geometric pattern, the geometric pattern including a phase edge and at least one assist edge proximate the phase edge, wherein the assist edge is adapted to improve the resolution of the phase edge.

Another preferred embodiment of a phase shift mask includes a substrate that permits light to pass through, the substrate comprising a geometric pattern, the geometric pattern including a phase edge and at least one assist edge proximate the phase edge.

Further disclosed is a preferred embodiment of a method of manufacturing a semiconductor device, comprising providing a semiconductor wafer, depositing a resist layer on the semiconductor wafer, illuminating portions of the resist layer to leave at least a first illuminated resist portion, a first non-illuminated resist portion adjacent the first illuminated resist portion, a second illuminated resist portion adjacent the first non-illuminated resist portion, a second non-illuminated resist portion adjacent the second illuminated resist portion, and a third illuminated resist portion adjacent the second non-illuminated resist portion. The method includes removing at least the first, second and third illuminated resist portions, and removing at least the first non-illuminated resist portion.

Advantages of the embodiments of the present invention include enhancing the resolution of an alternating phase shift mask. The assist edges are positioned at a pre-determined distance from the main phase edge in order to improve the aerial image contrast. Smaller feature sizes may be manufactured on a semiconductor wafer than with prior art phase shift masks in accordance with embodiments of the present invention.

BRIEF DESCRIPTION OF THE DRAWINGS

The above features of embodiments of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

A description of a prior art alternating phase shift mask and preferred embodiments of the present invention will be discussed, followed by a discussion of some advantages of embodiments of the invention.

Figure 1:
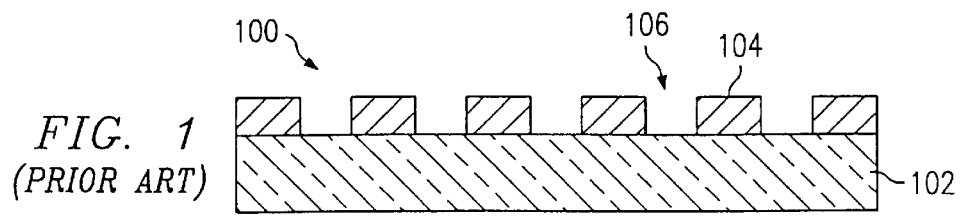
FIG. 1 illustrates a cross-sectional view of a prior art lithography mask.
Figure 2:
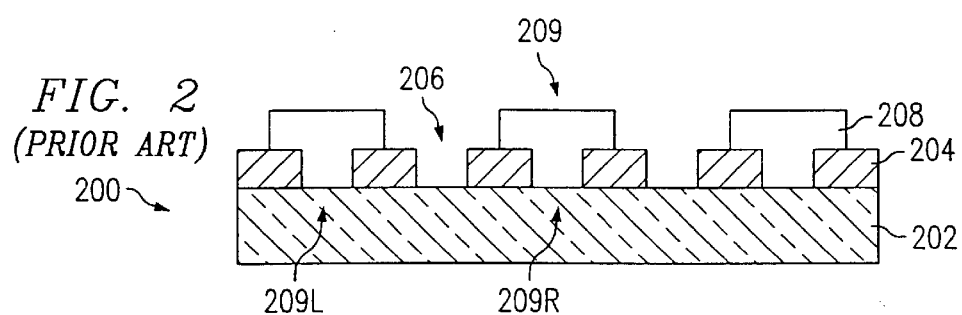
FIG. 2 illustrates a cross-sectional view of a prior art alternating phase shift mask.
Figure 3:
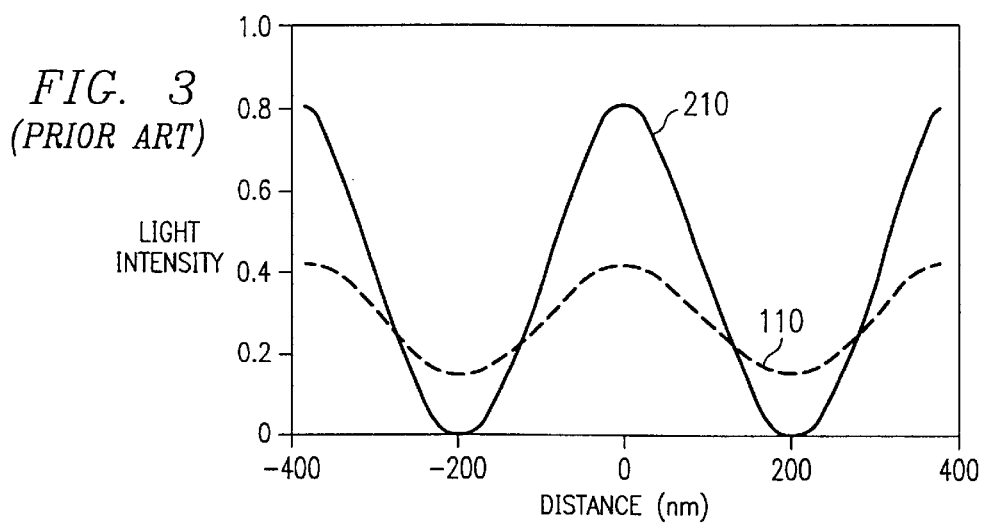
FIG. 3 illustrates a graph of the light intensity of the prior art phase shift mask and the prior alternating phase shift mask.
Figure 4:
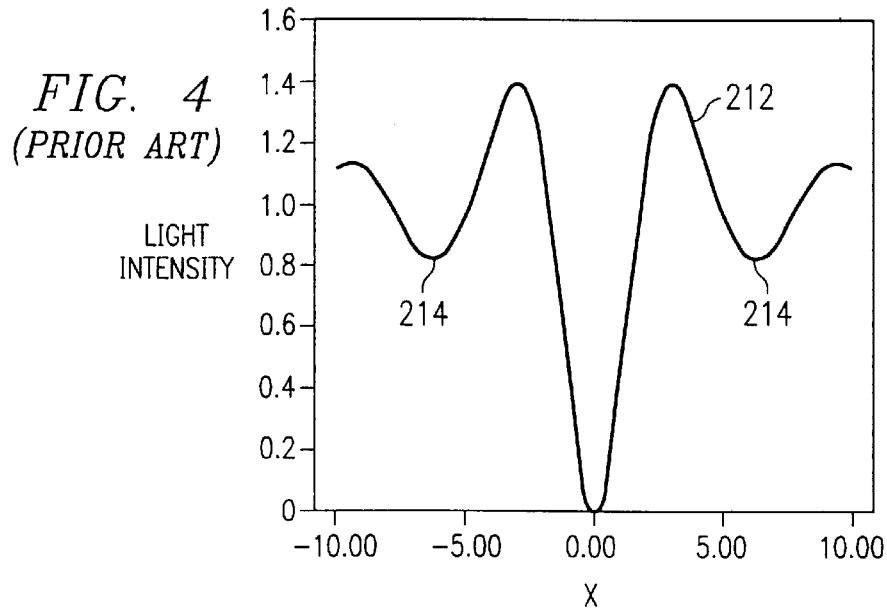
FIG. 4 shows the light intensity distribution profile resulting from an alternating phase shift mask, which requires trimming of the excess resist.
Figure 5A:
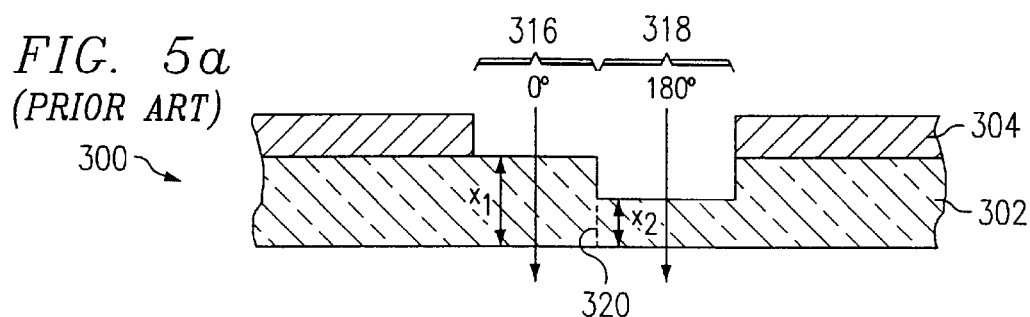
FIG. 5A shows a cross-sectional view of a prior art alternating phase shift mask having a single phase edge.
Figure 5B:
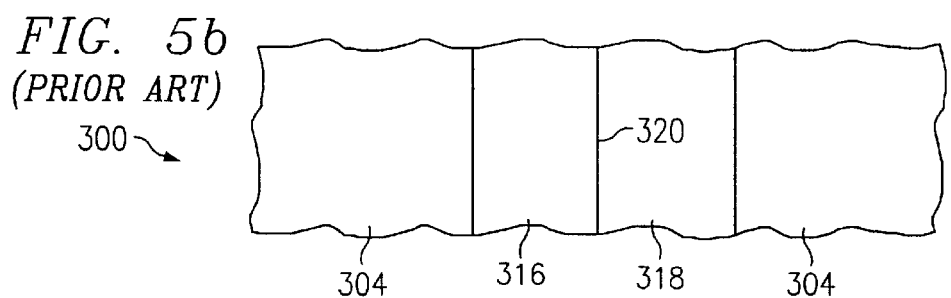
FIG. 5B shows a top view of the prior art alternating phase shift mask having one phase edge.

FIGS. 5A through 5D illustrate a prior art alternating phase shift mask 300 in which a phase shift is created by providing a substrate 302 having a varying thickness. Substrate 302 has a greater thickness $X_1$ in transparent region 316 than at transparent region 318 having a smaller thickness $X_2$. The difference in thicknesses $X_1$ and $X_2$ typically comprises an appropriate amount sufficient to produce a 180° phase shift in light passing through transparent regions 316 and 318. A single phase edge 320 is created at the area where transparent regions 316 and 318 meet. Opaque regions 304 are typically comprised of an opaque material such as chrome, for example. A top view of the alternating phase shift mask 300 having a phase edge 320 is shown in FIG. 5B.

Figure 5C:
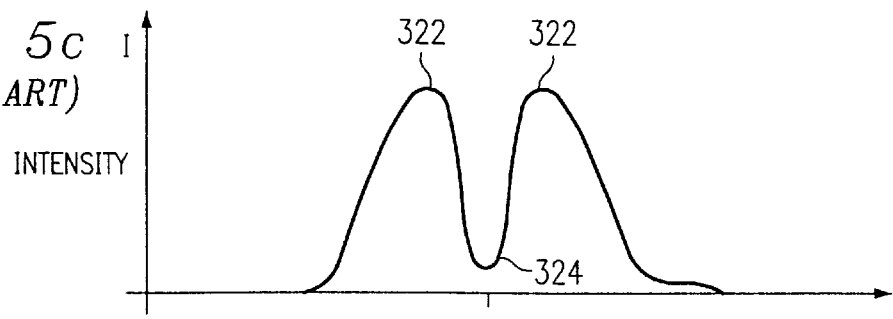
FIG. 5C illustrates a graph of a light intensity profile of the prior art alternating phase shift mask of FIGS. 5A and 5B.

A light intensity profile of the prior art alternating phase shift mask 300 shown in FIGS. 5A and 5B is shown in FIG. 5C. The curve includes lobes 322 and a lobe 324 comprising a main edge that is produced by phase edge 320 on the mask 300.

Figure 5D:
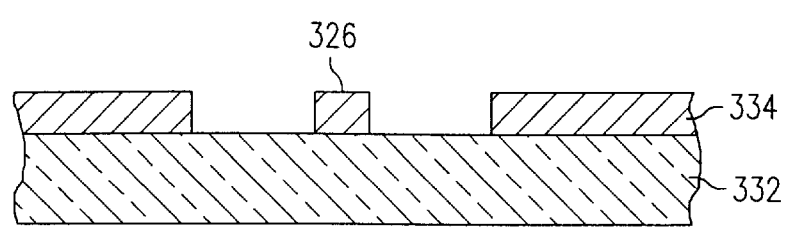
FIG. 5D illustrates a cross-sectional view of resist on a semiconductor wafer patterned by the prior art alternating phase shift mask.

FIG. 5D shows a cross-sectional view of a semiconductor wafer 330 patterned by the prior art alternating phase shift mask 300 shown in FIGS. 5A and 5B. Wafer 330 comprises a substrate 332. The substrate 332 may comprise single-crystal silicon, and may include oxide layers, conductive layers or other semiconductor elements, e.g., transistors or diodes, for example.

A resist layer 334 is deposited over the substrate 332. The resist layer 334 preferably comprises an organic polymer and may comprise a photoresist, for example.

The pattern on the alternating phase shift mask 300 is transferred to the wafer 330 resist layer 334 by exposing the wafer 330 to a light source, for example, through the mask 300 (of FIGS. 5A and 5B). The pattern transferred to the wafer 330 is shown in FIG. 5D. Features 326 are formed as a result of the phase edge 320 on the mask 300. Features 326 may comprise a line or etch run, for example, and alternatively may comprise other semiconductor device features, as examples.

A problem with the prior art alternating phase shift mask 300 shown in FIGS. 5A through 5D is that the contrast of the single phase edge 320 may be blurred or fuzzy, resulting in an inaccurate ability to pattern the resist layer 334. This creates limitations in the amount that the feature 326 size can be scaled down and minimized.

Embodiments of the present invention provide a method of improving mask resolution, allowing for a greater reduction in feature size.

One assumption of prior art alternating phase shift masks designs was that the best resolution for optical lithography could be achieved by employing a single phase edge 320 on a mask, which is achieved by the use of an alternating phase shift mask such as the one shown in FIGS. 5A–5D. The phase edge 320 creates a dark region 324, which leaves a photoresist line 326 when a positive photoresist in used. The contrast between the dark line 324 and the surrounding bright regions 322 is relatively high, thus creating a sharp and well-defined resist line 326.

Embodiments of the present invention provide an alternating phase shift mask 400 that improves this contrast further, enabling the formation of even smaller lines or features than in the prior art. Embodiments of the present invention achieve this by positioning assist phase edges a predetermined distance away from and on either side of the main phase edge. The assist phase edges improve the contrast of the main phase edge.

Figure 6A:
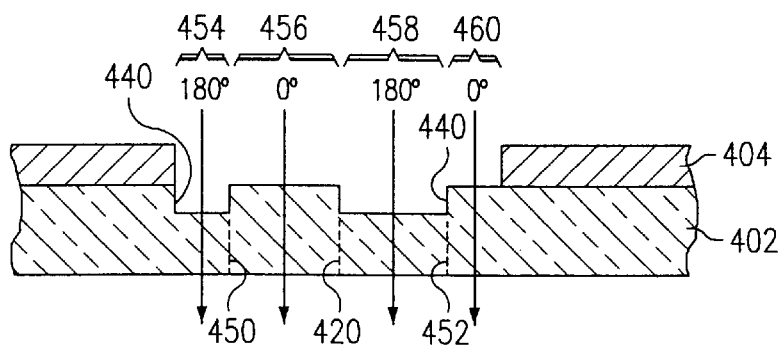
FIG. 6A shows a cross-sectional view of an alternating phase shift mask according to an embodiment of the present invention having one main phase edge and two assist phase edges.

FIGS. 6A through 6D illustrate a preferred embodiment of the present invention. FIG. 6A shows a cross-sectional view of an alternating phase shift mask 400 in accordance with an embodiment of the present invention. A substrate 402 is provided. Substrate 402 preferably comprises a transparent material, such as silicon quartz, and alternatively comprises other transparent substrate materials, for example. The substrate 402 may be about ½ inch thick, for example.

The substrate 402 is patterned and etched to produce regions 440 having a predetermined depth in the top surface of the substrate 400. Regions 440 create phase shift regions where light will be shifted by 180°.

An optional opaque layer 404 is deposited over the substrate 402. Preferably, opaque layer 404 comprises chrome, and alternatively may comprise other metals or opaque insulative materials, for example. In an embodiment of the present invention, no opaque layer 404 is used. The opaque layer 404 is patterned and etched to expose the underlying transparent substrate 402. Preferably, the opaque layer 404 may be deposited, patterned and etched prior to the patterning of phase shifting regions 440 within the substrate 400, for example. Alternatively, the opaque layer 404 may be deposited, patterned and etched after patterning the phase shifting regions 440 of the substrate 402.

A main phase edge 420 for patterning a feature on a wafer is positioned in the center of the mask 400 cross-sectional view, as shown, at the intersection of transparent region 456 and phase shifted transparent region 458. Alternatively, the main phase edge 420 for patterning a feature on a wafer may be located non-centrally within transparent region 458, for example.

In accordance with a preferred embodiment of the present invention, at least one assist edge is positioned proximate the main phase edge 420. More preferably, two assist edges 450 and 452 are positioned a predetermined distance away from and on either side of the main phase edge 420, as shown in FIG. 6A. For example, the assist edges may be disposed between around 200–400 nm from the phase edge, although the predetermined distance is a function of the exposure wavelength. For example, for a 248 nm exposure wavelength, preferably, the assist edges 450/452 are placed a distance of 300–320 nm on either side of the main phase edge 420.

The assist edges 450 and 452 are preferably formed by patterning regions 440 having a predetermined depth into the top surface of the substrate 402. Alternatively, assist edges 450 and 452 may be formed by depositing additional transparent layers on the substrate 402, or depositing materials that provide the required phase shift, for example, other transparent materials.

Preferably, transparent regions 454 and 458 produce a 180° phase shift, whereas transparent regions 456 and 460 produce a zero degree phase shift in light being passed through the mask 400, for example. The alternating phase shift of light creates an assist edge 450 at the intersection of phase shifted transparent region 454 and transparent region 456. Similarly, on the other side of the main phase edge 420, the alternating phase shift of light creates an assist edge 452 at the intersection of phase shifted transparent region 458 and transparent region 460.

Figure 6B:
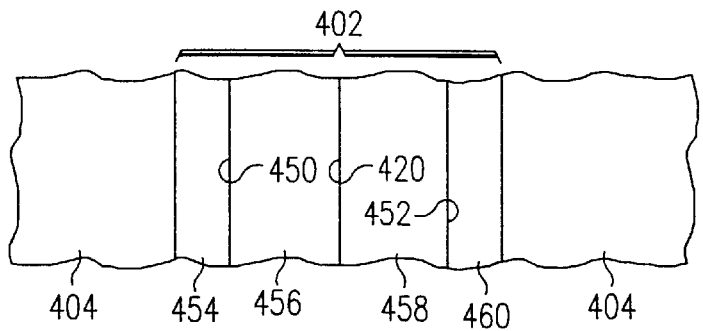
FIG. 6B shows a top view of the alternating phase shift mask according to an embodiment of the present invention having one main phase edge and two assist phase edges.

FIG. 6B illustrates a top view of an embodiment of a portion of the present alternating phase shift mask 400. Opaque regions 404 on either side of transparent areas in the substrate 402 block the light, whereas the transparent region 402 allows light to pass through. Again, regions 454 and 458 provide a 180° phase shift, and regions 456 and 460 produce a zero degree phase shift of light transmitted through the mask 400. Phase edge 420 and assist edges 450 and 452 may extend a partial or full length of the mask 400, for example, in accordance with the desired pattern.

Figure 6C:
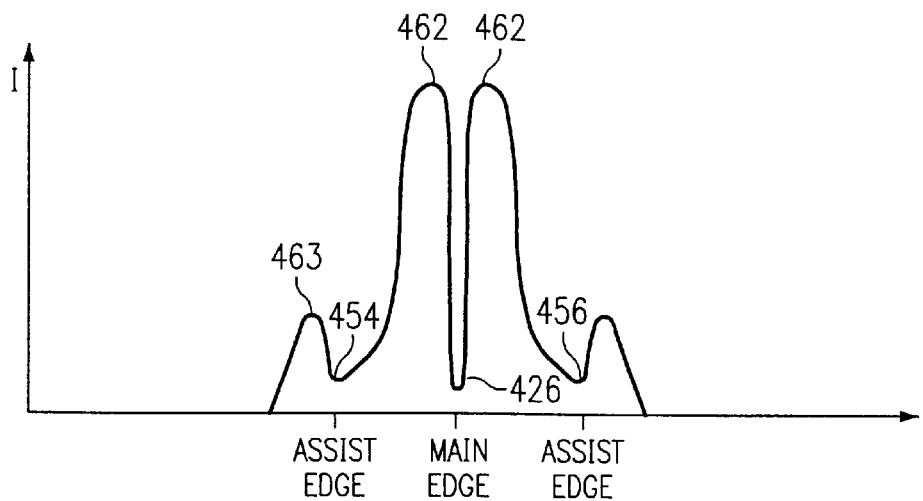
FIG. 6C illustrates a graph of the light intensity profile of an embodiment of the alternating phase shift mask.

FIG. 6C illustrates a profile of the intensity of light passed through mask 400 in accordance with a preferred embodiment of the present invention. The curve includes side lobes 462 of brightness and a dark region 426 representing the main phase edge produced by the main phase edge 420 of the mask 400. The curve also includes dark regions 454 and 456 on either side of dark region 426 that are created by assist edges 450 and 452 on the mask 400.

The slope of the light intensity shown in FIG. 6C is greater than the slope of the light intensity shown in the prior art light intensity graph shown in FIG. 5C. The increased slope of the light intensity curve of the present invention is indicative of the higher resolution provided by an embodiment of the present mask 400 having assist edges 450/452. The slope of the intensity profile may be from 20 to 50% greater than in prior art alternating phase shift masks, for example.

Figure 6D:
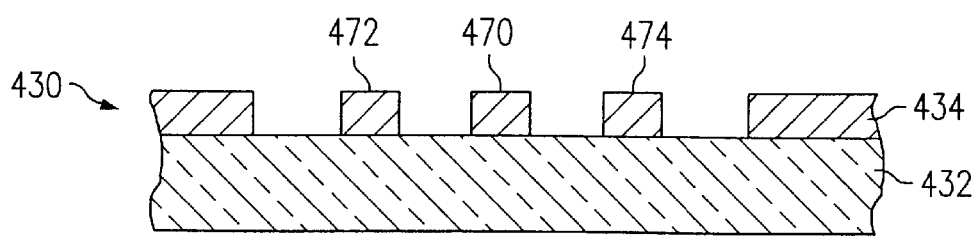
FIG. 6D illustrates a cross-sectional view of a semiconductor wafer having a resist patterned by the present alternating phase shift mask in accordance with an embodiment of the present invention.

FIG. 6D shows a cross-sectional view of a semiconductor wafer 430 that has been patterned by a preferred embodiment of the present alternating phase shift mask 400. Wafer 430 includes a substrate 432 that may comprise single-crystal silicon, and may include oxide layers, conductive layers or other semiconductor elements, e.g., transistors or diodes, for example. Compound semiconductors such as GaAs, InP, Si/Ge, SiC may be used in place of silicon as a substrate material.

A resist layer 434 is deposited over the substrate 432. The resist layer 434 preferably comprises an organic polymer and may comprise a photoresist, for example.

The pattern of an embodiment of the present alternating phase shift mask 400 is transferred to the wafer 430 resist layer 434 by exposing the wafer 430 to a light source, for example, through the mask 400.

The pattern transferred to the wafer 430 is shown in FIG. 6D. Features 470 and assist edge features 472 and 474 are formed as a result of the phase edge 420 and assist edges 450/452, respectively on the alternating phase shift mask 400. Features 426 may comprise a line or etch run, and alternatively may comprise other semiconductor device features, as examples. Features 426 are preferably between 30% and 60% of the exposure wavelength wide, and preferably around 45% of the exposure wavelength. For example, features 426 may be between 80 nm to 140 nm wide. The assist features 472 and 474 print out at approximately the same size as the main feature 426.

The assist edges 472 and 474 are removed by exposure through a trim mask (not shown). Preferably, the exposure through a trim mask is performed while leaving the wafer 430 on the same wafer stage within the process chamber as was used when exposing the wafer 430 to the alternating phase shift mask 400, according to an embodiment of the present invention. Leaving the semiconductor wafer 430 on the stage is beneficial because it ensures that alignment of the trim mask pattern to the phase shift mask pattern 400 is achieved. Because prior art alternating phase shift masks also require a trim exposure, advantageously, this does not require an additional process step. A trim exposure is currently typically required with the use of single phase edge masks to remove unwanted resist patterns that originate from phase conflicts at line or feature ends.

Advantages of using assist phase edges 450 and 452 in accordance with embodiments of the present invention to improve mask 400 resolution will next be described. Each assist phase edge 450/452 creates a dark region e.g. at 454 surrounded by bright regions, e.g., 462/463, on the light intensity profile, where adjacent the dark region, the intensity is greater than the background intensity, as shown in FIG. 6C. This phenomenon may also be referred to as a side lobe 462. If the side lobes of the assist phase edges overlap the side lobe of the main phase edge, the intensity of the bright region next to the main dark line increases. The image slope, which defines the contrast of the aerial image, increases significantly when using assist phase edges in accordance with embodiments of the present invention. Therefore, the ultimate resolution of a mask employing assist phase edges is improved, compared to prior art alternating phase shift masks.

By placing at least one assist edge 450/452 a predetermined distance from the main phase edge 420 on the mask 400, the aerial image contrast can be enhanced, and thus resolution is improved. The improved aerial image contrast produced by embodiments of the present invention results in the ability to pattern smaller features or lines 470 on a semiconductor wafer 432 with a given exposure tool. The intensity of the side lobe 462 of the light intensity profile is than much higher compared to the light intensity profile of a prior art single phase edge mask, thus increasing the image log slope of the aerial image. In prior art masks having a single phase edge, the light intensity profile slope goes through a shallow maximum when decreasing the shifter width, and then decreases again. In comparison, in embodiments of the alternating phase shift mask 400 having assist phase edges 450/452, the light intensity profile slope is greatly increased as compared to the single phase edges, and the maximum can be pushed closer to the dark part of the aerial image. Embodiments of the present invention increase the ultimate resolution for optical lithography.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a phase shift mask, comprising:
   providing a substrate, the substrate being transparent;
   patterning the substrate with geometric pattern, the geometric pattern including a phase edge and at least one assist phase edge proximate the phase edge, wherein patterning a semiconductor wafer wit the mask induces a pattern including a feature formed by the phase edge and a feature formed by each at least one assist phase edge, wherein the assist phase edge is adapted to improve the resolution of the feature formed by the phase edge on the semiconductor wafer.

2. The method according to claim 1, wherein patterning the substrate comprises patterning one assist phase edge disposed on either side of the phase edge.

3. The method according to claim 2 wherein patterning the substrate comprises patterning the assist phase edges equidistant from the phase edge.

4. The method according to claim 3 wherein patterning the substrate comprises patterning the assist phase edges between 200–400 nm from the phase edge.

5. The method according to claim 1 wherein providing a substrate comprises providing a quartz substrate.

6. The method according to claim 1, further comprising:
   depositing an opaque layer over the substrate; and
   patterning the opaque layer.

7. The method according to claim 6 wherein depositing an opaque layer comprises depositing chrome.

8. The method according to claim 1, wherein patterning the substrate comprises patterning the substrate with regions having a first thickness and regions having a second thickness, wherein the phase shift between the first and second thickness regions is 180 degrees, wherein the phase edge and assist phase edge reside at an intersection of a first and second thickness region.

9. A phase shift mask, comprising:
   a substrate that permits light pass through, the substrate comprising a geometric pattern, the geometric pattern including a phase edge and at least one assist phase edge proximate the phase edge, wherein a semiconductor wafer patterned with the mask has a pattern including a feature patterned by the phase edge and a feature patterned by each at least one assist phase edge.

10. The phase shift mask according to claim 9, wherein the substrate comprises a first assist phase edge disposed proximate the phase edge and a second assist phase edge disposed proximate the phase edge, the phase edge being positioned between the first and second assist phase edges.

11. The phase shift mask according to claim 10 wherein the first and second assist phase edges are disposed equidistant from the phase edge, wherein the first and second assist phase edges are adapted to improve the resolution of the feature patterned by the phase edge.

12. The phase shift mask according to claim 11 wherein the first and second assist phase edges are disposed between 200–400 nm from the phase edge.

13. The phase shift mask according to claim 9, wherein the substrate comprises:
   a first region having a first thickness;
   a second region having a second thickness abutting the first region, wherein the intersection of the first and second region comprises an assist phase edge; and
   a third region abutting the second region, the third region being of the first thickness, wherein the intersection of the second and third regions comprises the phase edge.

14. The phase shift mask according to claim 13, wherein the substrate comprises:
   a fourth region abutting the third region, the fourth region being of the second thickness, wherein the intersection of the third and fourth regions comprises an assist phase edge.

15. The phase shift mask according to claim 14, further comprising a first opaque region abutting the first region, and a second opaque region abutting the fourth region.

16. The phase shift mask according to claim 15, wherein the first and second opaque regions comprise chrome.

17. The phase shift mask according to claim 14, wherein the substrate first thickness regions transmit light phase shifted 180 degrees with respect to light transmitted by the substrate second thickness regions.

18. The phase shift mask according to claim 9 wherein the substrate comprises a quartz substrate.

19. A method of manufacturing a semiconductor device, comprising:
   providing a semiconductor wafer;
   depositing a resist layer on the semiconductor wafer;
   illuminating portions of the first layer to leave at least a first illuminated resist portion, a first non-illuminated rest portion adjacent the first illuminated resist portion, a second illuminated resist portion adjacent the first non-illuminated resist portion, a second non-illuminated resist portion adjacent the second illuminated resist portion, and a third illuminated resist portion adjacent the second non-illuminated resist portion;
   removing at least the first, second and third illuminated resist portions;
   removing at least the first non-illuminated resist portion; and
   effecting the semiconductor wafer with the second non-illuminated resist portion, wherein illuminating portions of the resist layer comprises illuminating portions of the resist layer through a phase shift mask the phase shift mask comprising a substrate, the substrate being adapted to permit light to pass through, the substrate comprising a geometric pattern, the geometric pattern including a phase edge and at least one first assist phase edge proximate the phase edge, wherein the phase edge forms the second non-illuminated resist portion, wherein the first assist phase edge forms the first non-illuminated resist portion, wherein the first assist phase edge is adapted to improve the resolution of the second non-illuminated resist portion.

20. The method according to claim 19, wherein the phase shift mask geometric pattern includes a second assist phase edge proximate the phase edge, wherein illuminating portions of the resist layer also leaves a third non-illuminated resist portion adjacent the third illuminated resist portion and a fourth illuminated resist portion adjacent the third non-illuminated resist portion, where the second assist phase edge farms the third non-illuminated resist portion, further comprising removing the fourth illuminated resist portion, and after effecting the semiconductor wafer, removing the third non-illuminated resist portion, wherein the second assist phase edge is adapted to improve the resolution of the second non-illuminated resist portion.

21. The method according to claim 19, wherein removing the illuminated resist portions and removing the non-illuminated resist portions comprise separate steps.

22. The method according to claim 19, wherein effecting the semiconductor wafer comprises patterning the semiconductor wafer using the resist layer as a mask.

23. The method according to claim 19, wherein providing a phase shift mask comprises providing a phase shift mask including a substrate comprising regions having a first thickness and regions having a second thickness, wherein the phase shift between the first and second thickness region is 180 degrees, wherein the phase edge and first assist phase edge reside at the intersection of a first and second thickness region.

24. The method according to claim 23, wherein providing a phase shift mask comprises providing a phase shift mask having a substrate comprising two assist phase edges, one of the assist phase edges being disposed on either side of the phase edge.

25. The method according to claim 24 wherein providing a phase shift mask comprises providing a phase shift mask including two assist phase edges disposed equidistant from the phase edge.

26. The method according to claim 25 wherein providing a phase shift mask comprises providing a phase shift mask having a substrate including assist phase edges disposed between 200–400 nm from the phase edge.

27. The method according to claim 19, wherein manufacturing a semiconductor device comprises manufacturing a dynamic random access memory (DRAM).

28. A method of patterning material layer of a semiconductor wafer, comprising:
   providing a mask having a first transparent portion, a second transparent portion abutting the first transparent portion a third transparent portion abutting the second transparent portion, and a fourth transparent portion abutting the third transparent portion, the first and third transparent portions having a first phase shift, the second and fourth transparent portions having a second phase shift;
   providing a semiconductor wafer having a material layer formed thereon;
   forming a resist on the material layer of the semiconductor wafer;
   illuminating energy towards the semiconductor wafer resist through the mask to form illuminated regions of resist and non-illuminated regions of resist, wherein the non-illuminated regions of resist comprise a first portion corresponding to an edge between the mask first transparent portion and the mask second transparent portion, a second portion corresponding to an edge between the mask second transparent portion and the mask third transparent portion, an a third portion corresponding to an edge between the mask third transparent portion an the mask fourth transparent portion;
   removing the illuminated regions of resist from the semiconductor wafer;
   removing the first and third portions of resist from the semiconductor wafer;
   effecting the material layer of the semiconductor wafer using the second portion of resist as a mask; and
   removing the second portion of resist from the semiconductor wafer.

29. The method according to claim 28, wherein providing a mask comprises providing a mask having a first opaque portion abutting the first transparent portion and a second opaque portion abutting the fourth transparent portion.

30. The method according to claim 28, wherein providing a mask comprises providing a mask having first and third transparent portions having a first thickness, and having second and fourth transparent portions having a second thickness.

31. The method according to claim 28, wherein the mask first phase shift is shifted 180 degrees from the second phase shift.

* * * * *

UNITED STATES PATENT AND TRADEMARK OFFICE
CERTIFICATE OF CORRECTION

PATENT NO.      : 6,605,396 B2
DATED           : August 12, 2003
INVENTOR(S)     : Schroeder et al.

It is certified that error appears in the above-identified patent and that said Letters Patent is hereby corrected as shown below:

Column 1,
Line 8, delete "semiconductors" and substitute -- semiconductor. --.

Column 9,
Line 7, delete "rest" and substitute -- resist --.
Line 37, delete "where" and substitute -- wherein --.
Line 38, delete "farms" and substitute -- forms --.

Column 10,
Lines 37 and 38, delete "an" and substitute -- and --.

Signed and Sealed this

Twenty-third Day of December, 2003

JAMES E. ROGAN
*Director of the United States Patent and Trademark Office*